United States Patent [19]

Ito

[11] Patent Number: 5,357,196

[45] Date of Patent: Oct. 18, 1994

[54] CIRCUIT FOR CONVERTING A FREQUENCY OF AN INPUT SIGNAL SO A SIGNAL HAVING A DIGITAL VALUE CORRESPONDING TO THE FREQUENCY

[75] Inventor: Akio Ito, Konosu, Japan

[73] Assignee: Jeco Company Limited, Japan

[21] Appl. No.: 922,758

[22] Filed: Jul. 30, 1992

[30] Foreign Application Priority Data

Aug. 6, 1991 [JP] Japan .................. 3-196838
Feb. 25, 1992 [JP] Japan .................. 4-037941

[51] Int. Cl.⁵ .............. G01P 3/481; G01P 3/489; G01R 23/10
[52] U.S. Cl. ................. 324/166; 324/76.39; 324/76.44; 324/76.47; 324/146; 364/565
[58] Field of Search ............. 324/160, 166, 167, 173, 324/174, 76.28, 76.39, 76.41, 76.42, 76.44, 76.47, 76.48, 143, 144, 146; 364/565, 569, 572; 328/140; 377/3, 15, 24

[56] References Cited

U.S. PATENT DOCUMENTS

| 4,208,626 | 6/1980 | Gregg, Jr. ............. 324/76.47 X |
| 4,521,867 | 6/1985 | Kasuga . |
| 4,580,047 | 4/1986 | Sasaki et al. .......... 324/173 |
| 4,841,238 | 6/1989 | Birch ................... 324/167 X |
| 4,962,470 | 10/1990 | Hansen ............... 364/569 X |
| 4,977,525 | 12/1990 | Blackwell ............. 324/166 X |
| 5,007,035 | 4/1991 | Markow et al. ....... 304/166 X |

OTHER PUBLICATIONS

Papoulis, Athanasious, Circuits & Systems: A Modern Approach, p. (5.101) ISBN 0-03-056097-7, Copyright 1980 by Holt Rinehart and Winston, Inc. (no month).

Primary Examiner—Gerard R. Strecker
Attorney, Agent, or Firm—Andrus, Sceales, Starke & Sawall

[57] ABSTRACT

A measuring circuit with a simple circuit configuration is capable of correcting dispersion of a characteristic of a display apparatus and of displaying the measurement result. The measuring circuit comprises an edge detecting circuit, for outputting an edge detection signal synchronous with clock pulses by performing sampling on an input signal, the sampling being performed using clock pulses having a frequency higher than a frequency of the input signal, a gate circuit outputting a first factor when receiving the edge detection signal from the edge detection circuit, a digital integrating filter circuit for outputting a signal having digital values converging to values corresponding to the frequency of the input signal by timing sampling operation based on cycles of the clock pulses.

16 Claims, 17 Drawing Sheets

FIG. 19

| PRTM | RP | TFVC | MODE | OPERATION | |
| --- | --- | --- | --- | --- | --- |
| | | | | SP | TM |
| H | L | H | QUICK RESPONSE | NORMAL OPERATION | QUICK RESPONSE (TRIPLE CLOCK) |
| L | L | H | QUICK RESPONSE | NORMAL OPERATION | SLOW RESPONSE (DOUBLE CLOCK) |
| — | H | H | ZERO RESET | ZERO RESET OPERATION | ZERO RESET OPERATION |

FIG. 20

| COUNT | 0 | 1 | 3 | 2 | 6 | 7 | 5 | 4 |
| --- | --- | --- | --- | --- | --- | --- | --- | --- |
| 6a-1Q  H/L | | | | | | | | |
| 6a-2Q  H/L | | | | | | | | |
| 6a-3Q  H/L | | | SP | | | | TM | |

FIG. 22

| | | COUNT | 0 | 1 | 3 | 2 | 6 | 7 | 5 | 4 |
|---|---|---|---|---|---|---|---|---|---|---|
| | | GSP, GTM | GSP | | | | GTM | | | |
| QUICK RESPONSE | | CLK1 | SPCLK1 | | | | TMCLK1 | | | |
| | | CLK2 | | SPCLK2 | | | | TMCLK2 | TMCLK2 | TMCLK2 |
| | | SELECTION CIRCUIT | Fx(SP) | FVDIO-2 | | | Fx(TM) | FVD9-2 | FVD9-2 | FVD9-2 |
| | | CORRECTION CIRCUIT | FVDIO-2 | FVDIO-1 | | | FVD9-2 | FVD9-1 | FVD9-1 | FVD9-1 |
| | | FILTER COMPUTING CIRCUIT | SIA | SIB | | | SIA | SIA | SIA | SIA |
| SLOW RESPONSE | | CLK1 | SPCLK1 | | | | TMCLK1 | | | |
| | | CLK2 | | SPCLK2 | | | | TMCLK2 | TMCLK2 | |
| | | SELECTION CIRCUIT | Fx(SP) | FVDIO-2 | | | Fx(TM) | FVD9-2 | FVD9-2 | |
| | | CORRECTION CIRCUIT | FVDIO-2 | FVDIO-1 | | | FVD9-2 | FVD9-1 | FVD9-1 | |
| | | FILTER COMPUTING CIRCUIT | SIA | SIB | | | SIA | SIA | SIA | |
| ZERO RESET | | CLK1 | SPCLK1 | | | | TMCLK1 | | | |
| | | CLK2 | | SPCLK2 | SPCLK2 | | | TMCLK2 | | |
| | | SELECTION CIRCUIT | Fx(SP) | FVD1 | FVDIO-2 | | Fx(TM) | FVD9-2 | | |
| | | CORRECTION CIRCUIT | FVDIO-2 | FVDIO-1 | FVDIO-1 | | FVD9-2 | FVD9-1 | | |
| | | FILTER COMPUTING CIRCUIT | SIA | SIB | SIB | | SIA | SIA | | |

CIRCUIT FOR CONVERTING A FREQUENCY OF AN INPUT SIGNAL SO A SIGNAL HAVING A DIGITAL VALUE CORRESPONDING TO THE FREQUENCY

BACKGROUND OF THE INVENTION

The present invention pertains to a measuring circuit, and more particularly to a measuring circuit for measuring a frequency of an input signal and for displaying it on a display apparatus.

Various measuring apparatuses are in use for controlling an operational status of a machine. Many of these apparatuses utilize a sensor for generating an electric signal of a certain frequency so as to perform a measurement of an operating speed or a speed of revolution, for example, of a machine. The above sensor is so configured as to display the measurement result on a display apparatus.

Apparatuses such as a speedometer of an automobile or a revolution indicator of an engine convert a frequency of an input signal from a sensor to an analog or digital indicated value by a measuring circuit, and display the value on a display apparatus.

Measuring circuits designed for supplying a signal to a display apparatus in response to a frequency of an input signal include circuits for counting the number of cycles in a predetermined period of time and converting the count into a frequency; also included are measuring circuits equipped with a function of measuring a time of one cycle and converting said time into a frequency. Another such circuit is known that converts a frequency directly into a voltage signal by using a frequency/voltage (F/V) converter.

FIG. 1 is a block diagram describing an example of a conventional frequency measuring/displaying apparatus 200. A detection pulse signal 201 from a speedometer or a revolution indicator and reference clock pulses 203 from clock pulse generating means 202 are input into a cycle detecting means 204. The cycle detecting means 204 detects a cycle T of the detection pulse signal by counting the number of reference clock pulses corresponding to a cycle of a detection pulse signal. Arithmetic means 206 not only calculates a frequency 1/T on the basis of a signal 205 having a cycle T but also determines by calculation an output 209 to be sent to a display apparatus driving means 210 on the basis of a parameter 208 supplied from a memory 207. The display apparatus driving means 210 converts the digital output signal 209 into a signal appropriate for the purpose of driving a display apparatus 212 to which a driving signal 211 is output.

However, the above-mentioned conventional measuring apparatus has a disadvantage in that it requires complex circuit construction and computation for mathematical division operations, it is required when detecting a frequency of a detection pulse signal, to first calculate a cycle T and then convert it to a frequency 1/T. Further, the characteristics of a display apparatus designed for analog display often exhibit dispersion, which is extremely difficult to correct and is an obstacle to accurate display.

Conventionally, when there is a need for a display of a plurality of measured values, such as in the case of a speedometer and a revolution indicator above, a normal practise is that a measuring circuit processes frequency signals corresponding to each measured value given, and various arithmetic operations are subsequently performed in correspondence with characteristics of each display apparatus before an output is sent to a display apparatus. Accordingly, when display apparatuses of both a speedometer and a revolution indicator are driven, measuring circuits are provided independently, one for a speedometer and one for a revolution indicator.

Such a configuration, in which a plurality of measuring circuits for driving a plurality of display apparatuses are required, brings about a large circuit scale and a rise in production cost. Hence a need for a measuring circuit having a simple circuit configuration capable of driving a plurality of display apparatuses with a single circuit.

SUMMARY OF THE INVENTION

A general object of the present invention is to provide a novel and useful measuring circuit for use in a frequency measurement display.

A more specific object of the present invention is to provide a measuring circuit capable of displaying while having the dispersion of display apparatuses corrected by a simple circuit configuration.

Another object of the present invention is to provide a measuring circuit capable of performing, by means of a single filter circuit, a filter processing in correspondence with each of a plurality of input frequency signals.

In order to achieve the above objects, the measuring circuit of the present invention is configured to be a measuring circuit for conducting measurement by converting a frequency of an input signal to a signal having digital values in correspondence with the frequency, and for displaying a measured value on a display apparatus comprising:

a clock pulse generating circuit for generating clock pulses having a frequency higher than the frequency of the input signal;

an edge detecting circuit connected to the clock pulse generating circuit and outputting an edge detection signal synchronous with the clock pulses after sampling the input signal on the basis of the clock pulses;

a gate circuit joined with the edge detecting circuit and outputting a first factor when receiving the edge detection signal from the edge detecting circuit;

a first digital filter connected to the gate circuit and the clock pulse generating circuit and outputting a signal having digital values, which corresponds to the frequency of the input signal and is determined by the first factor, while using a cycle of the clock pulse signals in determining the timing of sampling.

The measuring circuit of the present invention can also be configured to comprise adding means connected to the first digital filter, by which means an output of the gate means is added to a third factor for correcting an output from the first digital filter, the sum being input into the first digital filter, further comprising:

correcting means connected to the adding means, by which correcting means the third factor, which varies according to an output from the first digital filter, is output to the adding means.

The measuring circuit of the present invention for converting a frequency of a plurality of input signals to a signal having digital values in correspondence with each frequency and for selectively displaying a measured value on a display apparatus comprises:

a clock pulse generating circuit for generating clock pulses having a frequency higher than the frequency of the plurality of input signals;

a plurality of edge detecting circuits connected to the clock pulse generating circuit and outputting an edge detection signal synchronous with the clock pulses after sampling the plurality of input signals on the basis of the clock pulses;

a conversion control circuit connected to the plurality of edge detecting circuits and the clock pulse generating circuits, and outputting the plurality of input signals as a plurality of signals synchronous with the clock signals as well as sequentially generating and outputting a selection signal corresponding to the plurality of input signals at every predetermined cycle, on the basis of the clock signals;

a selection circuit connected to the conversion control circuit, receiving an input of the plurality of synchronous signals, and selecting and outputting one of the synchronous signals from the plurality of synchronous signals, on the basis of the selection signals; and a first digital filter connected to the selection circuit and the clock pulse generating circuit and outputting a signal having digital values, which corresponds to the frequency of the input signal selected by the selection circuit, and is determined by the first factor, while using a cycle of the clock pulse signals in timing its sampling operation.

The present invention makes it possible to easily adjust the sensitivity of a measuring circuit with a simple configuration which accomplishes an adjustment of the first factor by means of a first digital filter provided, the filter being provided to produce an output obtained by multiplying a digital value in correspondence with a frequency of an input signal by the first factor. Also, adjustment of the third factor accomplished by a circuit with a simple configuration allows for easy adjusting of an offset of a measuring circuit.

Further, a correction circuit helps an offset value vary in accordance with an output of the first digital filter, thereby correcting error characteristics of a display apparatus. Having such a ability to easily correct error characteristics of a display apparatus using circuit with a simple configuration ensures that the correcting means allows the obtaining of any correction characteristic as desired. Therefore, specialized measuring characteristics or high-precision measuring characteristics are easily provided.

Additionally, the present invention is characterized, for example, by its capability for realizing an inexpensive measuring circuit with a simple configuration, the circuit for use when a plurality of signals are to be measured, because a selection can be made based on one of a plurality of signals to be measured so that a single arithmetic circuit can handle it.

Other objects, features, and advantages of the present invention will be apparent with the following detailed description when studied in conjunction with the attached drawings.

BRIEF DESCRIPTION OF THE DRAWINGS

FIG. 19 is a diagram for describing an operation of the third embodiment of the present invention;

FIG. 20 is a diagram for describing an operation of the third embodiment of the present invention;

FIG. 22 is a diagram for describing an operation of the third embodiment of the present invention.

DESCRIPTION OF THE PREFERRED EMBODIMENTS

A description of the principle of a measuring circuit of the present invention will be given with reference to a block diagram of FIG. 2.

Figure 1:
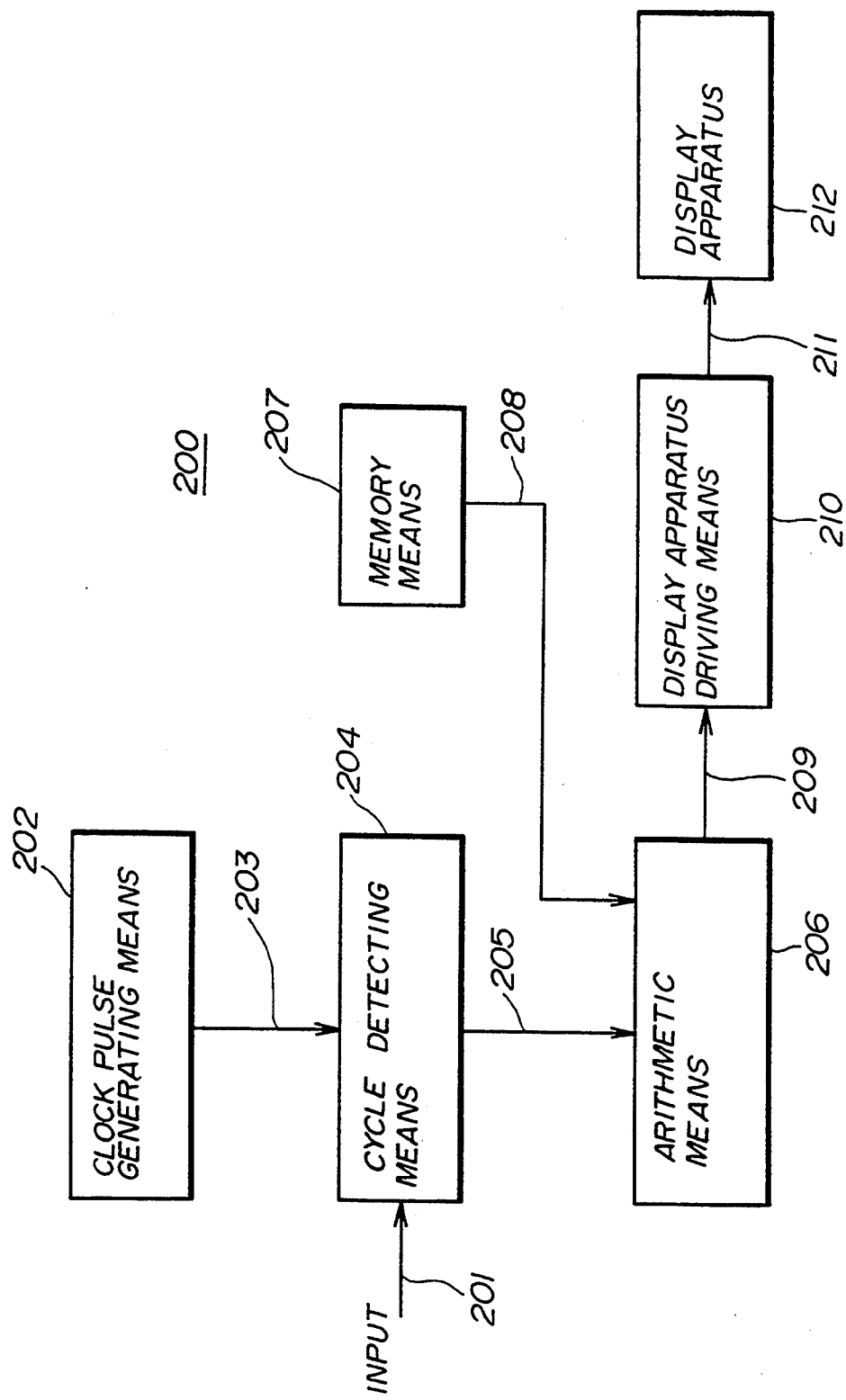
FIG. 1 is a block diagram describing the principle of an example of a conventional frequency measuring/displaying apparatus.
Figure 2:
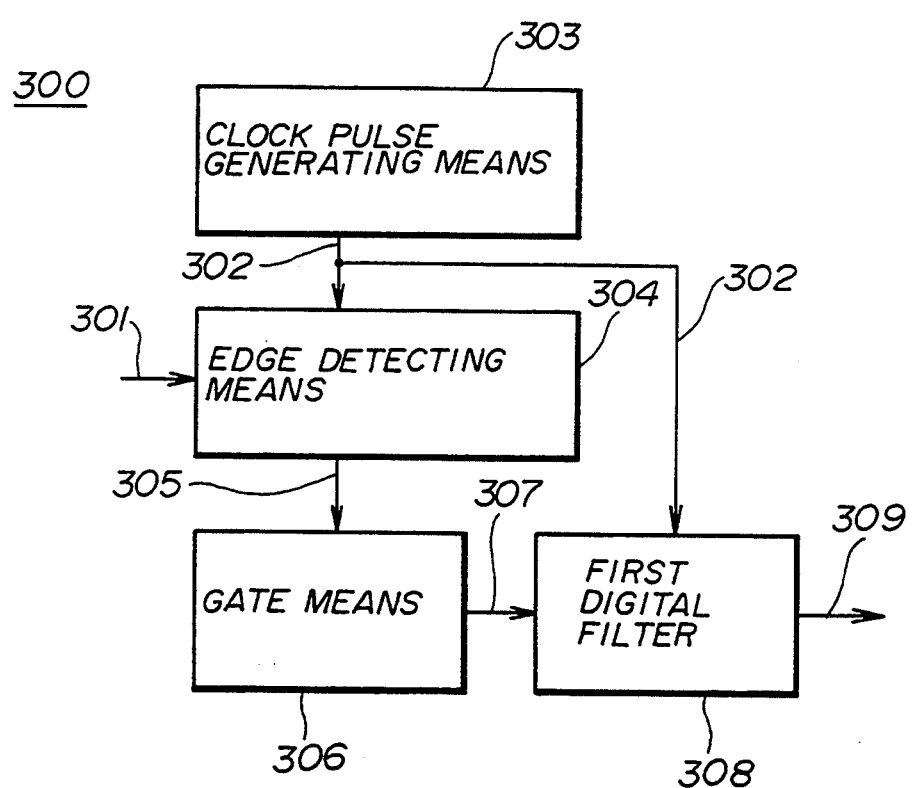
FIG. 2 is a block diagram depicting a configuration of the present invention.

A measuring circuit 300 of FIG. 2 is configured such that a frequency of an input signal 301 is measured by being converted to a signal having digital values associated with the frequency; the measured frequency is then displayed on a display apparatus. Clock pulse generating means 303 generates clock pulses 302 having a frequency higher than the frequency of the above-mentioned input signal 301, and supplies them to edge detecting means 304. The edge detecting means 304 performs sampling on the input signal 301 on the basis of clock pulses 302 and outputs an edge detection signal 305 that is synchronous with the clock pulses 302. Gate means 306 outputs a first factor 307 when receiving an edge detection signal 305 from the edge detecting means 304. A first digital filter 308 determines sampling timing by referring to the cycle of the clock pulses 302 and outputs a digital signal 309 in correspondence with the frequency of the input signal 301. The output 309 from the first digital filter 308 has a value derived from the multiplication of a signal having digital values corresponding to the frequency of the input signal by the first factor, as a result of inputting, into the first digital filter 308, the output 307 from the gate means 306 which outputs the first factor upon receiving the edge detection signal. Adjustment of this first factor allows adjustment of sensitivity of the measuring circuit.

Figure 3:
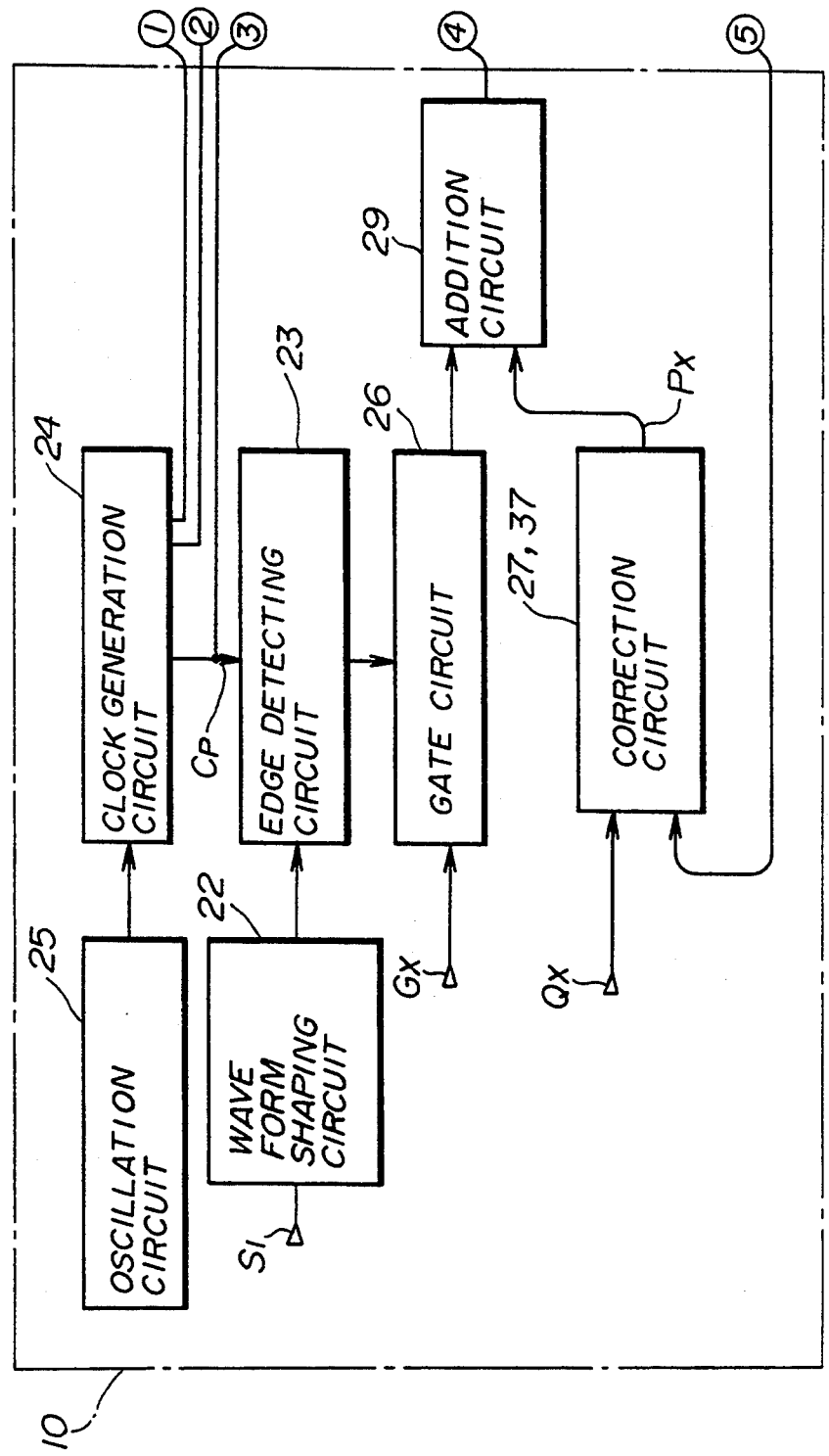
FIG. 3 is a part of a block diagram that includes the measuring circuits of the first and second embodiments of the present invention.
Figure 4:
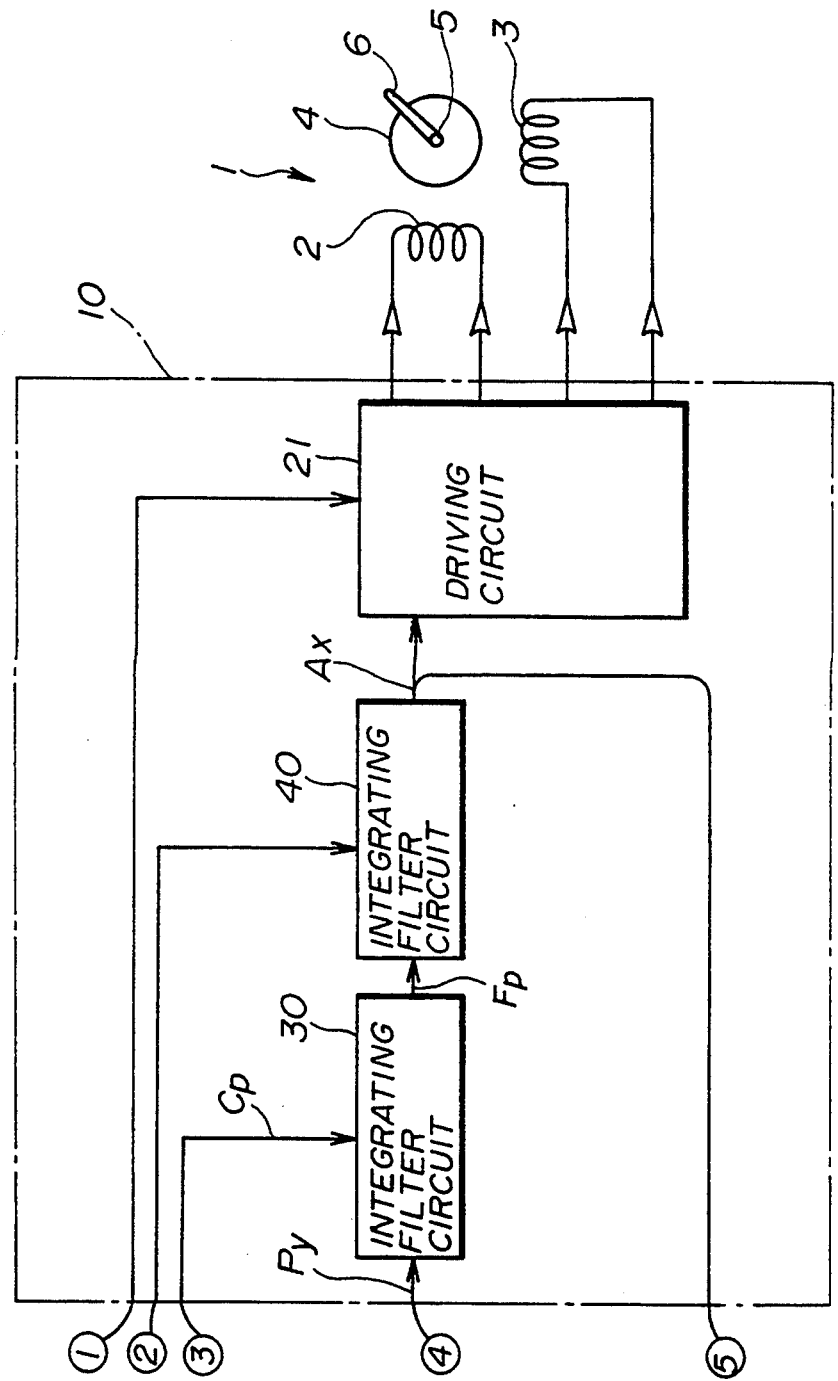
FIG. 4 is a part of a block diagram that includes the measuring circuits of the first and second embodiments of the present invention.

A description of the first and second embodiments of the present invention will be given with reference to FIGS. 3 and 4. FIGS. 3 and 4 are block diagrams that include the measuring circuit of the first and second embodiments of the present invention. The above embodiments are a measuring circuit for a tachometer used for indication of an engine revolution speed.

A measuring circuit 10 comprises: an oscillating circuit 25 and a clock generating circuit 24 that correspond to the clock pulse generating means 303; a waveform shaping circuit 22; an edge detecting circuit 23 corresponding to the edge detecting means 304; a gate circuit 26 corresponding to the gate means 306; correction circuits 27, 37; an addition circuit 29, an integrating filter circuit 30 corresponding to the first digital filter 308; an integrating filter circuit 40; and a driving circuit 21. The waveform shaping circuit 22, the correction circuits 27, 37, the addition circuit 29, the integrating filter circuit 40, and the driving circuit 21 are circuits provided in addition to the measuring circuit 300 of FIG. 2, and the functions thereof will be described in the following description.

Terminals ①~⑤ of lines shown at the extreme right of FIG. 3 are continuous with terminals ①~⑤ of lines shown at the extreme left of FIG. 4. The difference between the first and second embodiments is only in the configurations of the correction circuits; namely the measuring circuit 10 of the first embodiment is equipped with the correction circuit 27 and the measuring circuit 10 of the second embodiment is equipped with the correction circuit 37.

The notation numeral 1 at the extreme right of FIG. 4 represents a display apparatus. In this embodiment, a display apparatus of a cross coil type is employed.

Figure 5:
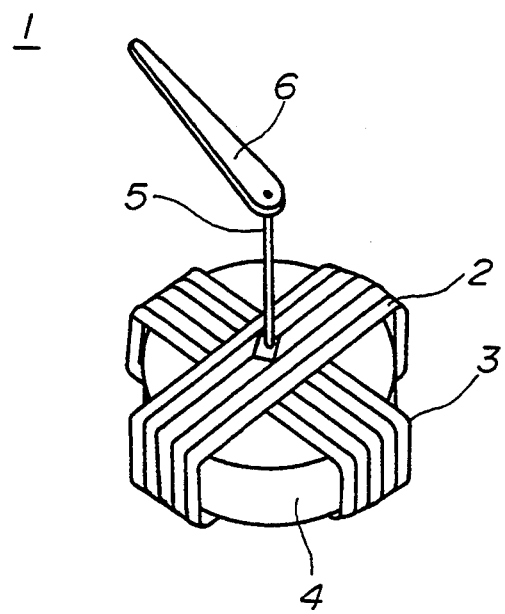
FIG. 5 is a perspective view of a display apparatus.

FIG. 5 is a perspective view of a display apparatus 1 represented in FIG. 4. The display apparatus 1 is of a cross coil type, and comprises a pair of coils, namely a sine coil 2 and a cosine coil 3, that are disposed at a mechanical cross angle of 90° with respect to each other. A movable magnet 4 is disposed in an interior space surrounded by these coils 2 and 3; an indicator axis 5 extends upward from the center of the movable magnet 4; an indicator 6 is fixed onto the top end of the indicator axis 5. A dial plate (not shown) is disposed so as to cover the range of movement of the tip of the indicator 6. The display apparatus 1 is mounted onto a dashboard of a driver's seat of an automobile, for example. The indicator 6 indicates an engine revolution speed to a driver.

Figure 6:
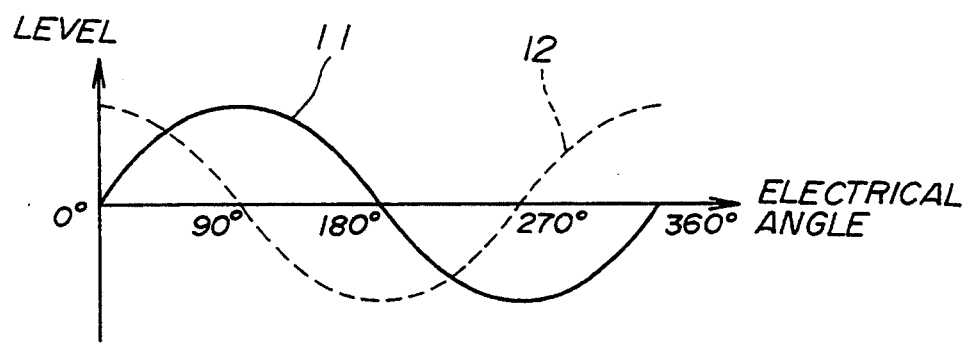
FIG. 6 is a diagram showing a graph of a signal supplied to the display apparatus of FIG. 5.

The display apparatus 1 of the above configuration operates by supplying the sine coil 2 and the cosine coil 3 with signals having a level corresponding to an electrical angle A formed by a sine wave 11 and a cosine wave 12, which waves have a phase difference of 90° as shown in FIG. 6. Driving signals having such phase difference are supplied from the driving circuit 21 shown in FIG. 4 to the display apparatus 1 on the basis of a signal $A_X$ output from the integrating filter circuit 40. The level of the signal $A_X$ is proportional to the frequency of an input $S_1$, the electrical angle A mentioned above being determined by the signal $A_X$. For example, when the input $S_1$ is 100 Hz, the level of the digital signal $A_X$ is 100 and the electrical angle of the driving signal input into the display apparatus is 90°. When the input $S_1$ is 200 Hz, the level of $A_X$ is 200 and the electrical angle is 180°. An angle of rotation of the indicator 6 of the display apparatus 1 is equal to this electrical angle. Therefore a configuration is established such that the value indicated by the display apparatus 1 is proportional to the frequency of the input $S_1$.

In this embodiment, the input signal $S_1$ having a frequency corresponding to an engine revolution is input to the measuring circuit 10. The input signal $S_1$ is converted into the output signal $A_X$ having an amplitude associated with the frequency of the input signal $S_1$. Further, the output signal $A_X$ is converted, by the driving circuit 21, to a signal having a phase lead or a phase lag depending on the variation of the output signal $A_X$, and this signal with either a phase lead or a phase lag is supplied to the display apparatus.

The input signal $S_1$ is an AC voltage signal having a frequency f and is supplied from a tachometer connected to a revolving shaft of an engine. The signal $S_1$ is input to the waveform shaping circuit 22 so as to be shaped into a roughly rectangular wave, after which shaping it is input into the edge detecting circuit 23. In this embodiment, the frequency f of the input signal $S_1$ is set to be 1 Hz when an engine revolution speed is 30 rpm.

The clock generating circuit 24 generates clock pulses Cp having a frequency higher than the frequency f of the input signal $S_1$, on the basis of a signal generated in the oscillating circuit 25. These clock pulses Cp are input into the edge detecting circuit 23. In this embodiment, the frequency of the clock pulses Cp is set to be 8192 Hz, and the electrical angle A supplied to the display apparatus 1 is set to be 90° when the level of the signal $A_X$ output from the measuring circuit 10 is 1024. Accordingly, the revolution speed of 9000 rpm (300 Hz) gives an $A_X$ value of 3072 and the electrical angle of the display apparatus 1 is 270°.

The edge detecting circuit 23 performs sampling on the input signal $S_1$ by means of the clock pulses Cp supplied from the clock generating circuit 24, and outputs an edge detection signal synchronous with the clock pulses Cp.

Figure 7:
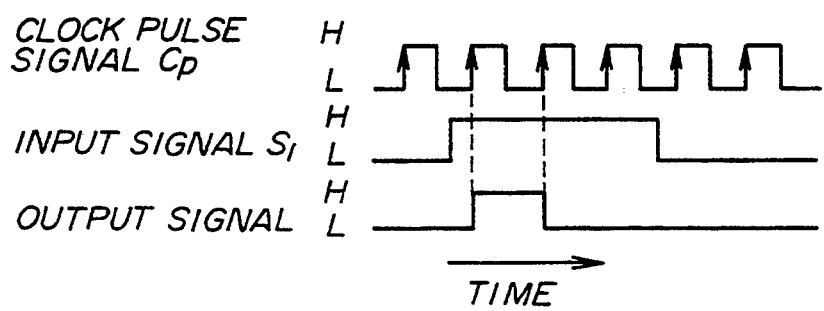
FIG. 7 is a diagram showing a time chart of a function of an edge detecting circuit of the main portion of the present invention.

FIG. 7 is a time chart of the input signal $S_1$, the clock pulses Cp, and the output signal of the edge detecting circuit 23. The output signal is allowed to rise to a high level (hereinafter simply represented as "H") at the rise of a clock pulse Cp that comes immediately after the input signal $S_1$, shaped by the waveform shaping circuit 22, rises to a level H. The output signal is allowed to fall to a low level (hereinafter simply represented as "L") at the rise of the next clock pulse Cp. Thus, the output signal is maintained at H only during one cycle of a clock pulse, the cycle constituting the clock pulses Cp, immediately following the rise of the input signal $S_1$.

The gate circuit 26 is constituted of AND logical circuits, for example, and is equipped with a function of outputting a set sensitivity value $G_X$ corresponding to the aforementioned first factor 1, only when there is an output from the edge detecting circuit 23. This set sensitivity value $G_X$ is a factor for determining a measure of deflection of the indicator 6 of the display apparatus 1 with respect to the range of variation of the frequency f of the input signal $S_1$.

Figure 8:
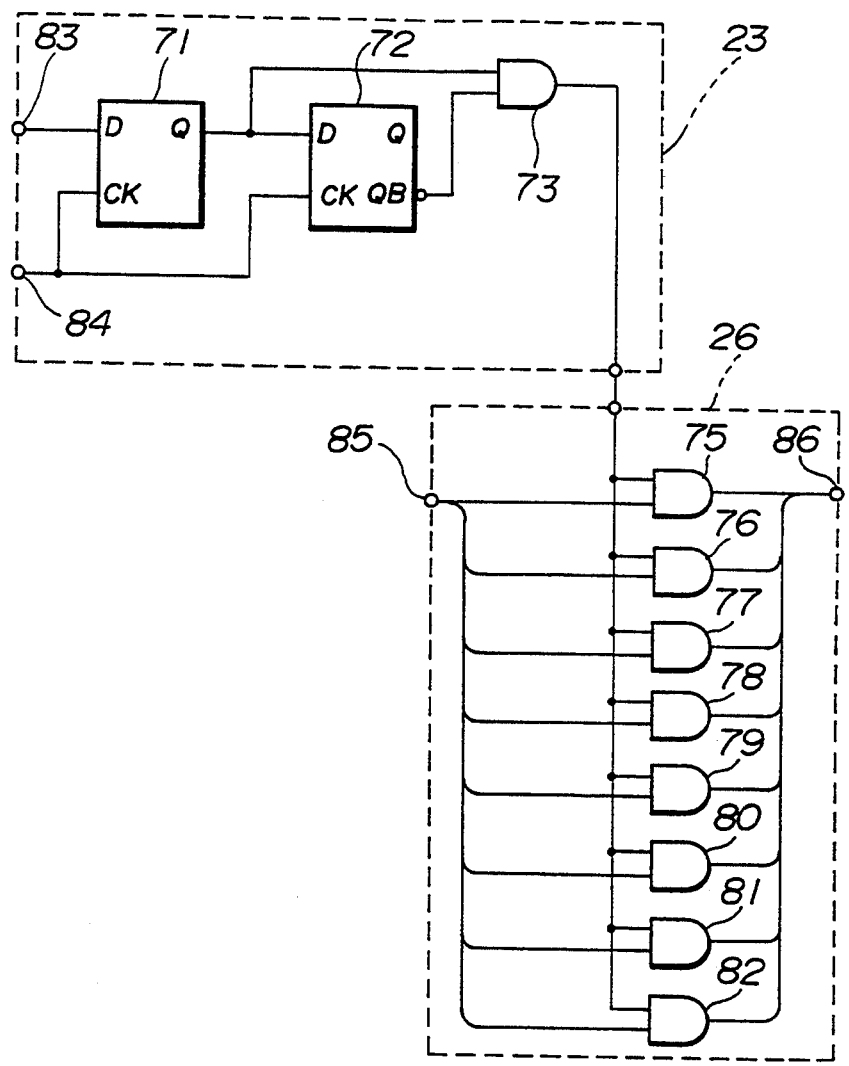
FIG. 8 is a diagram depicting a configuration of an edge detecting circuit and a gate circuit of the main portion of the present invention.

FIG. 8 shows a configuration of the edge detecting circuit 23 and the gate circuit 26, wherein logical circuits are employed. Referring to FIG. 8, 71 and 72 represent D flip-flops and 73–82 represent AND logical circuits. D flip-flops 71 and 72 retain, as an output value Q, a D input value at the rise of a CK input, a QB output being derived by reversing the Q output.

The edge detecting circuit 23 and the gate circuit 26 of the above configuration have terminals 83–85, into which the input signal $S_1$, the clock pulses Cp, and the set sensitivity value $G_X$ are input. The set sensitivity value $G_X$ is output from the terminal 86 only under the predetermined conditions described below.

A description will be given of an operation of the edge detecting circuit 23 and the gate circuit 26 of the above configuration. While the signal $S_1$ input into the terminal 83 is L, the Q output of the flip-flop 71 is L, therefore the Q output of the flip-flop 72 is L and the QB output thereof is H. Consequently, the inputs into the AND logical circuit 73 are L and H; the output therefrom is L; the outputs from the AND logical circuits 75–82 are all L.

When the input signal $S_1$ rises to H followed by a rise of the clock pulse Cp, the Q output of the flip-flop 71 is H. On the other hand, because the D input of the flip-flop 72 remains L at the rise of the clock pulse Cp, the Q output thereof is L and the QB output thereof remains H. Therefore, the inputs into the AND logical circuit 73 are both H, resulting in that the output therefrom is H. The AND logical circuits 75–82 output to the terminal 86 the set sensitivity value $G_X$ input into the terminal 85.

At the rise of the next clock pulse Cp, the Q output of the flip-flop 72 is H and the QB output therefrom is L because the input signal $S_1$ remains H and the Q output of the flip-flop 71 is held at H. Therefore, the inputs into the AND logical circuit 73 are H and L; the output therefrom is L; the outputs from the AND logical circuits 75–82 are all L.

Thereafter, when the input signal $S_1$ is H, the statuses of the flip-flops 71 and 72 remain unchanged; the statuses of the AND logical circuits 73–82 do not change. When the input signal $S_1$ becomes L, the Q output from the flip-flop 71 becomes L, and the inputs into the AND logical circuits remain L. This state continues until the input signal $S_1$ rises to H. Thereafter, the aforementioned operations repeat themselves. That is, the operations as shown in the time chart of FIG. 7 take place, and a roughly rectangular wave is output as an edge detecting signal.

While this embodiment is configured such that a rising edge of the input signal $S_1$ is detected in correspondence with the cycle of the clock pulses Cp, it can also be configured to have a similar function taking advantage of a trailing edge of the input signal $S_1$.

Since the clock pulses Cp generated by the clock generating circuit 24 are configured to be of a frequency higher than the frequency of the input signal $S_1$, as described above, it is ensured that the cycles of the clock pulses Cp corresponding to each cycle of the input signal $S_1$ are separate from each other.

The edge detecting circuit 23 can also be configured such that the roughly rectangular wave obtained as the edge detection signal in the above operations is divided or multiplied as required before being output, and a display magnification is set to match the division and multiplication operations.

The correction circuits 27 and 37 allow a set offset value value $Q_X$ to vary with respect to the value of $A_X$ output from the integrating filter circuit 40, and outputs the result as an offset value $P_X$ corresponding to the third factor. That is, a configuration is provided in which $P_X$ is defined as a function of $A_X$. This offset value $P_X$ corrects a display error due to the dispersive characteristics of the display apparatus 1. In this embodiment, the set offset value is set to be $Q_X=68$, which is a value corresponding to the electrical angle of roughly $6°$.

When there is no need for a correction by allowing the set offset value $Q_X$ to vary, $Q_X$ can be output as $P_X$ unmodified. In case it is possible to perform offset adjustment (zero-point adjustment) of the display apparatus 1 by rotating the indicator 6 of the display apparatus 1 with respect to the indicator axis 5, there is no need for the set offset value $Q_X$.

The adding circuit 29 adds outputs from the gate circuit 26 and the correction circuits 27, 37 and outputs the sum as a signal Py.

Figure 9:
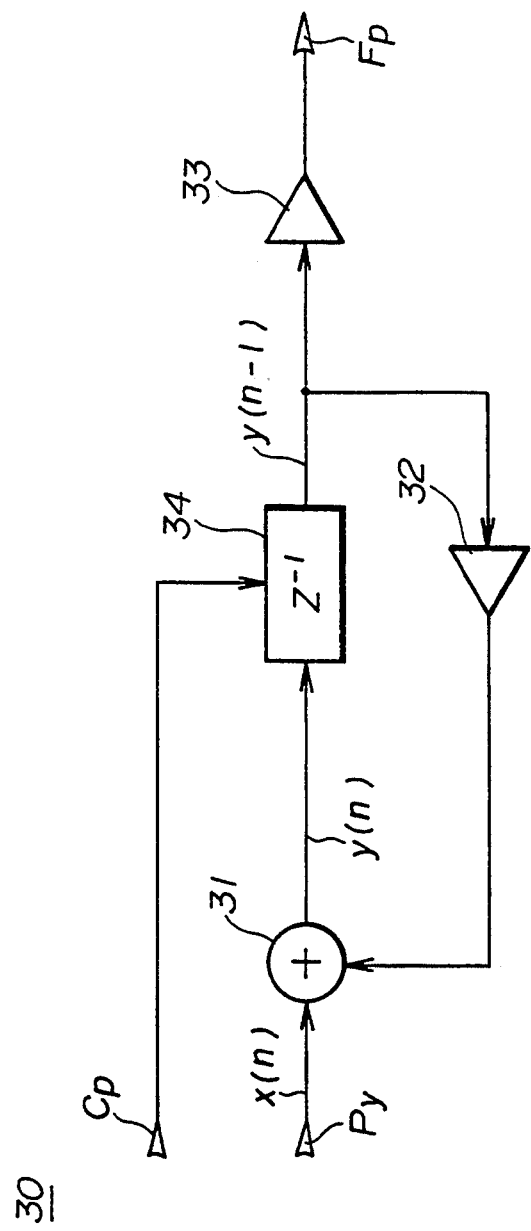
FIG. 9 is a block diagram of an integrating filter circuit of FIG. 3.

FIG. 9 is a block diagram of the integrating filter circuit 30. The integrating filter circuit 30 comprises an adder 31 corresponding to adding means, multipliers 32 and 33 corresponding to first and second multiplying means, and a delayer 34 corresponding to delaying means. The integrating filter circuit is a digital filter that utilizes the cycle of the clock pulses Cp supplied from the clock generating circuit 24 in timing its sampling operations.

The delayer 34 of the integrating filter circuit 30 retains the value obtained in the previous sampling; the multiplier 32 multiplies the value by a positive value a1 smaller than 1; the adder 31 adds the result to the input in the current sampling, the sum therefrom being input into the delayer 34.

Provided that, with respect to a number n updated as a sampling proceeds, an input into the adder 31 is x(n), an input into the delayer 34 is y(n), a multiplication factor of the multiplier 32 is a1, an output from the delayer 34 becomes y(n−1), and y(n) is expressed as;

$$y(n) = x(n) + a1 \cdot y(n-1) \tag{1}$$

In this embodiment, it is predetermined that $$a1 = 1023/1024$$

In this case, the integrating filter circuit 30 functions as an integrator and constitutes an integrating filter circuit by ensuring that the multiplication factor a1 of the multiplier 32 is in the following range:

$$1 > a1 > 0 \tag{2}$$

That is, when the signal Py is input at y(n−1)=0, x(n) becomes the signal Py, and y(n) becomes the signal Py. Until the signal Py is input again, x(n) is maintained at 0, while y(n) is decreased gradually by being multiplied by the factor a1, as n is updated at each cycle of the clock signal Cp.

When the input signal Py is input again, x(n) becomes the signal $P_X$, which signal is added, as an x(n), to y(n) that has gone through a decrease during the above processes. Thereafter, y(n) decreases until a signal Py is input anew, as is described above.

It is apparent from the above that a signal, where y(n) is increased and decreased in a waving manner, is output from the integrating filter circuit 30. The value of a1 determines a response characteristic of the measuring circuit 10 and can be set as required within the range given by the equation (2) above. The multiplication factor a2 of the adder 33 corresponding to the second factor can be set as desired and is actually set to be a value suitable for input into the integrating filter circuit 40 in the next circuit stage. In this embodiment, it is predetermined that $$a2 = 1/1024$$

The clock pulses Cp supplied to the integrating filter circuit 30 are the same as the clock pulses Cp supplied to the edge detecting circuit 23. As described earlier, the frequency of the clock pulses Cp is controlled to be higher than the frequency of the input signal $S_1$. Therefore, only those cycles of the clock pulses Cp that correspond to the rising edge are output as the edge detection signal from the edge detecting circuit 23 provided for detecting the rising edge of the input signal $S_1$.

When the rising edge of the input signal $S_1$ is not detected by the edge detecting circuit 23 and therefore the edge detection signal is not delivered, a signal input from the gate circuit 26 to the adding circuit 29 is absent and only the offset value $P_X$ is input from the correction circuits 27 and 37.

When the rising edge of the input signal $S_1$ is detected by the edge detecting circuit 23, the set sensitivity value $G_X$ is input from the gate circuit 26 into the adding circuit 29. This set sensitivity value $G_X$ is added to the offset value $P_X$ from the correction circuit 29 and is input into the integrating filter circuit 30.

In this embodiment, the frequency of the clock pulses Cp is controlled to be 8192 Hz. Assuming that the input signal $S_1$ has the same 8192 Hz frequency f as the frequency of the clock pulses, the gate circuit 26 always outputs $G_X$ because the edge detection signal is detected by the edge detecting circuit 23 with respect to all the cycles of the clock pulses Cp. The value of $G_X$ is set with reference to this assumption.

Specifically, since a proportion of 300 Hz of the input signal $S_1$ to the $A_X$ value of 3072 is provided as described before, the value of $G_X$ can be obtained from the following proportional expression $$300/8192 = 3072/G_X$$

as
$G_X = 83886$

Accordingly, an output signal Fp from the integrating filter circuit 30 is such that the offset value $P_X$, which is always output from the correction circuits 27 and 37, is added to the set sensitivity value $G_X$ when the rising edge of the input signal $S_1$ is detected, and the sum is decreased due to the multiplying factor a1 until the next rising edge of the input signal is detected.

The higher the frequency of the input signal $S_1$, the shorter the cycle of the variation of the output signal Fp of the integrating filter circuit 30, and the shorter the period between the time a rising edge of the input signal $S_1$ is detected and the time the next rising edge thereof is detected. Consequently, the number of times that y(n) is decreased by being multiplied by the multiplication factor a1 at each cycle of the clock pulses Cp is lower and the average level of the output signal Fp of the integrating filter circuit 30 is higher.

On the contrary, the lower the frequency of the input signal $S_1$, the longer the cycle, the more the number of times that y(n) is decreased due to the multiplying factor a1, and the lower the average level of the output signal Fp of the integrating filter circuit 30.

Thus, the average level of the output signal Fp of the integrating filter circuit 30 is defined by adding, to the continuous offset value $P_X$, the value obtained by integrating the intermittent input of the set sensitivity value $G_X$ so as to give it an amplitude proportional to the input signal $S_1$.

The integrating filter circuit 40 in this embodiment is of the same configuration as the integrating filter 30. Because the output signal Fp from the integrating filter circuit 30 exhibits a large fluctuation particularly when the frequency of the input signal $S_1$ is low, thus giving rise to a ripple that gives the indicator 6 of the display apparatus 1 a vibration, this integrating filter circuit 40 is added to the configuration in order to prevent this vibration by performing a filter process for eliminating the ripple.

The output signal $A_X$ from the integrating filter circuit 40 is input not only into the driving circuit 21 for driving the display apparatus 1 but also into the correction circuits 27 and 37 after being fed back as described earlier.

Figure 10:
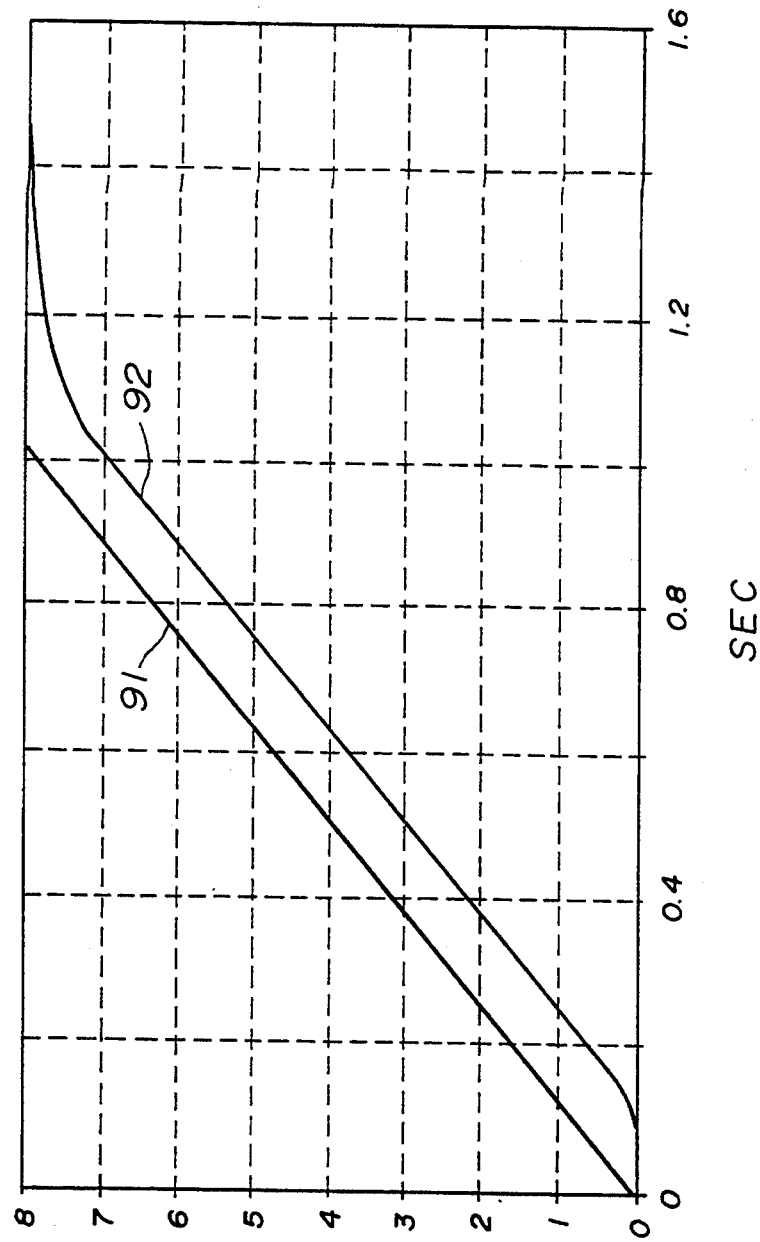
FIG. 10 is a diagram showing a rise characteristic of an output from an integrating filter circuit of the main portion of the present invention.

FIG. 10 is a graph showing a rise characteristic of the output signal $A_X$ of the integrating filter circuit 40 with respect to the frequency f of the input signal $S_1$. Referring to FIG. 10, the horizontal axis represents time (in seconds) and the vertical axis engine revolution speed (rpm). Curves 91 and 92 represent f and $A_X$ respectively as these two values are converted to a number of revolutions. It is evident from the graph that the output signal $A_X$ closely follows the input frequency f with a time lag of about 0.1 seconds over roughly the entire range of revolution.

Figure 11:
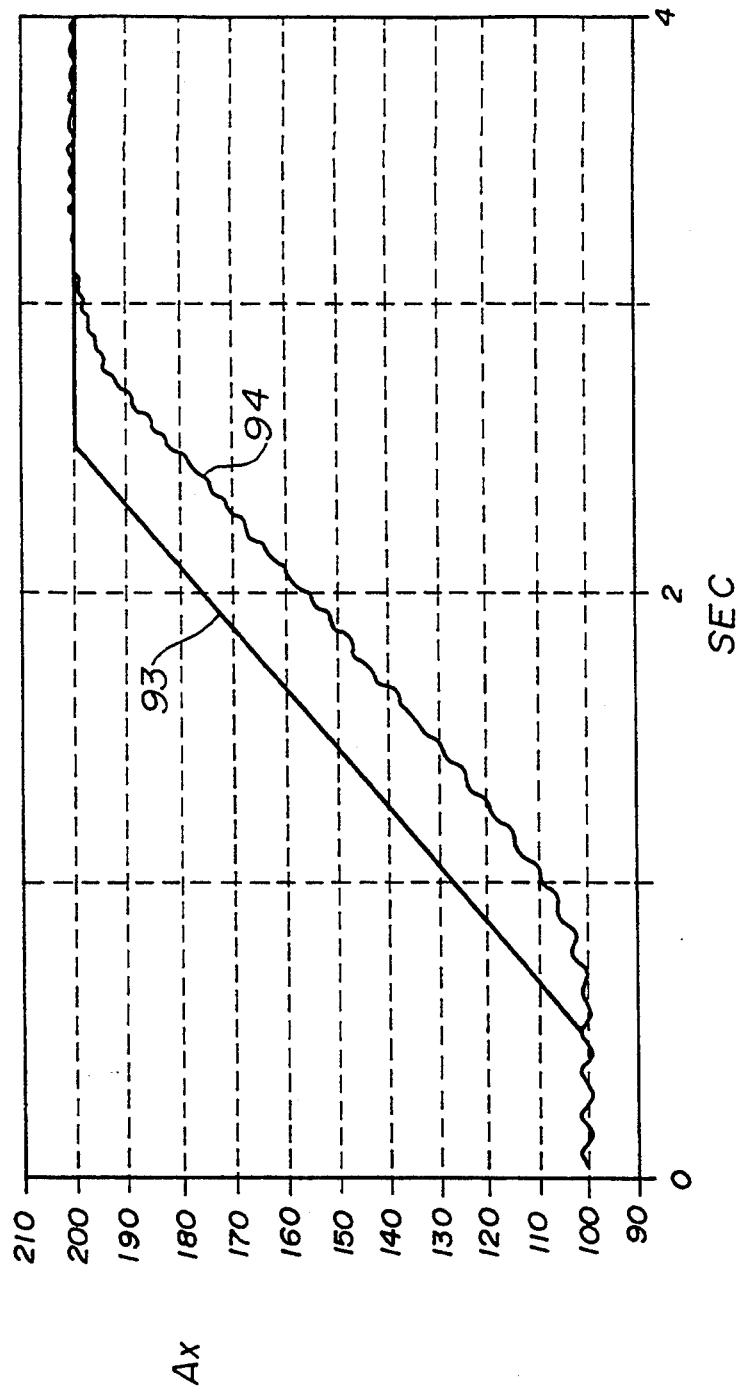
FIG. 11 is a diagram showing a graph obtained when a frequency of an input signal of FIG. 10 is low.

FIG. 11 is a graph showing a rise characteristic of the output signal $A_X$ with respect to the frequency f of the input signal when the frequency of the input signal $S_1$ is in an extremely low range. Referring to FIG. 11, the horizontal axis represents time (in seconds) and the vertical axis the value of $A_X$. Curves 93 and 94 represent f and $A_X$ respectively as these two values are converted to $A_X$ level. The part of the $A_X$ curve 94 that exhibits a slight waving corresponds to the aforementioned ripple.

Figure 12:
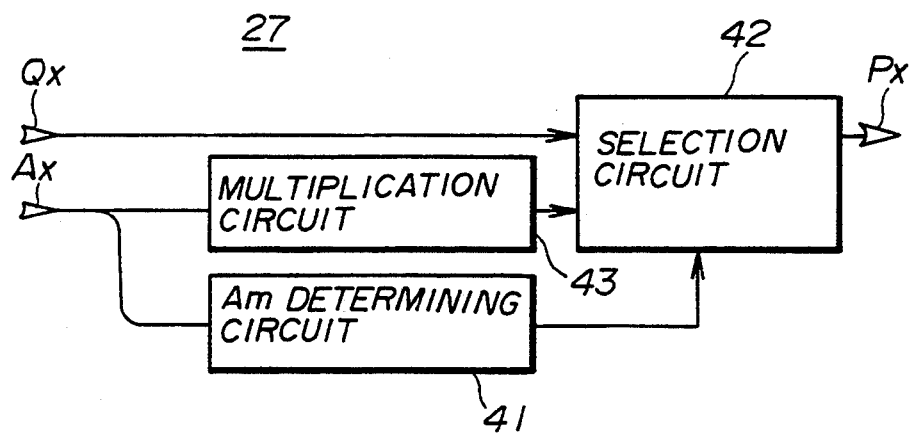
FIG. 12 is a block diagram of a correction circuit of the main portion of the first embodiment of the present invention.

A description will be given below of a configuration of the correction circuits 27 and 37. FIG. 12 is a block diagram of a correction circuit provided in the measuring circuit 10 of the first embodiment of the present invention. The correction circuit 27 of FIG. 12 is provided so as to allow the measuring characteristics Mp to vary as shown in FIG. 13.

In general, many analog display apparatuses do not indicate a zero point even when a zero-point signal is supplied from the measuring circuit due to an error in a display apparatus or to an effect of hysterisis characteristics inherent to the display apparatus. Hence, as shown in FIG. 13, the gradient of the measuring characteristics Mp is controlled to be steep when the frequency f of the input signal $S_1$ is nearer to zero than the point fm so that the signal, which is supplied to the display apparatus 1 when the frequency of the input signal $S_1$ is 0, is below the level Am that corresponds to the zero point, ensuring that the indicator 6 of the display apparatus 1 indicates the zero point.

The indicator 6 can also be configured to indicate the zero point, without fail, by providing a mechanical stopper in the display apparatus 1 so that the indicator 6 does not indicate a value below zero.

Figure 13:
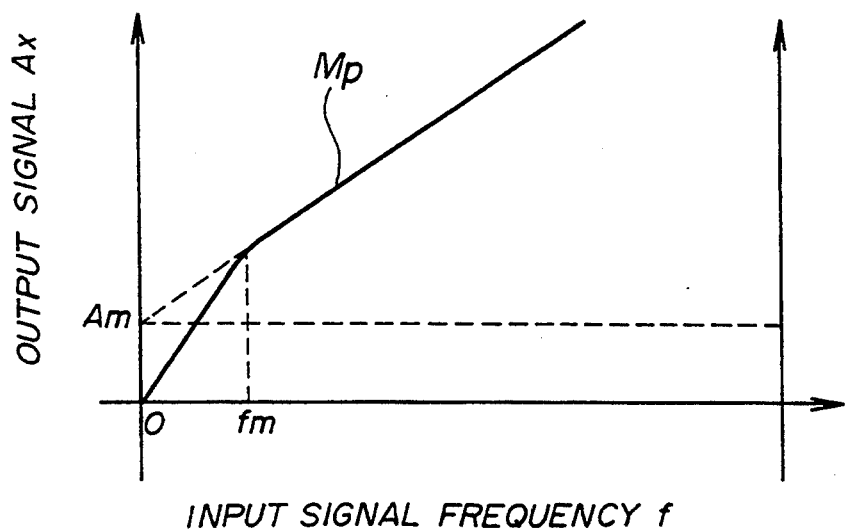
FIG. 13 is a diagram showing a graph of a measuring characteristic of a measuring circuit in which the correction circuit of FIG. 12 is applied.

In FIG. 13, given that:
the output to the driving circuit 21 is $A_X$;
the frequency of the input signal $S_1$ is f;
the sensitivity of the normal measuring circuit 10 is K1;
the offset (the output signal level $A_X$ when the frequency f of the input signal $S_1$ is zero) is Am;
the factor provided for rendering the gradient of the measuring characteristics Mp steep is K2;
the characteristics Mp in the range to the right of the terminal frequency fm, at which frequency the gradient of the measuring characteristics Mp is changed, are given by $$A_X = K1 \cdot f + Am; \qquad (3)$$

and the characteristics Mp in the range to the left of the terminal frequency fm are expressed by $$A_X = K1 \cdot f + K2 \cdot A_X; \qquad (4)$$

then, given all the above factors, the output signal $A_X$ converges, as a direct result of the equation (4), to $$A_X = K1 \cdot f/(1-K2). \qquad (5)$$

By providing that $$1 > K2 > 0 \qquad (6)$$

the gradient of characteristics Mp to the left of the terminal frequency fm can be rendered steep.

In this embodiment, the value of Am corresponds to the aforementioned $Q_X$ and is controlled to be 68. It is also provided that the $A_X$ value 3068, derived when f of the input signal is 300 Hz, is added to the offset Am, namely 68.

$$A_X = 3072 + 68 = 3140$$

It is thus found from the equation (3) above that $$3140 = K1 \cdot 300 + 68.$$

Hence,

K1 = 10.24.

Solving the equations (3) and (5) above for $A_X$ and K2 after inserting the values of Am and K1, providing that the terminal frequency fm, at which the gradient of the characteristics Mp changes, is 20 Hz and this value of fm is designated as f, we obtain:

$$A_X = 272.8$$

K2 = ¼ (Hz).

Referring to a block diagram of FIG. 12, an Am determination circuit 41 determines whether the level of the output signal $A_X$ fed back from the integrating filter circuit 40 is higher or lower than the level corresponding to the terminal frequency fm of the input signal $S_1$, at which frequency the gradient of the measuring characteristics Mp is allowed to change. The result of the determination is output to a selection circuit 42. A multiplying circuit 43 multiplies the signal $A_X$ by the above-mentioned factor K2 and outputs the product to the selection circuit 42.

The selection circuit 42 indicates a selection of the set offset value $Q_X$ set to be Am in the selection circuit 42 when the output from the above-mentioned Am determination circuit 41 determines that the frequency f of the input signal $S_1$, to which input signals the level of the output signal $A_X$ corresponds, is higher than fm. The selection circuit 42 indicates a selection of the output from the multiplier circuit 43 when the frequency f is lower than fm.

Accordingly, the correction circuit 27 outputs the set offset value $Q_X$, namely Am, as the offset value $P_X$ when the signal $A_X$ is higher than the level corresponding to the frequency fm. When lower, the circuit 27 outputs the offset value $P_X$ obtained by multiplying the signal $A_X$ by the factor K2. The output signal $A_X$ from the integrating filter circuit 40 converges to the value obtained as a result of being added to the offset value $P_X$. Accordingly, the characteristic Mp of the measuring circuit 10 will be such that corresponds to the equation (3) above when the frequency of the input signal $S_1$ is higher than fm; Mp will be the characteristic such that corresponds to the equation (4) above when the frequency of the input signal $S_1$ is lower than fm.

The above-mentioned configuration is not the only possible one since the measuring characteristics Mp can be varied by varying the above equations in various manners. For example, designating B1 as the first offset value and B2 as the second offset value, and representing the terminal frequency at which the gradient of the measuring characteristics Mp is allowed to change as fm, the characteristics to the right of fm can be expressed by $$A_X = K1 \cdot f + B1 + B2. \qquad (7)$$

Similarly, the characteristic Mp to the left of fm can be given by the following equation where the offset value (the value of the output signal $A_X$ when the frequency f of the input signal $S_1$ is zero) is a function of the output signal $A_X$.

$$A_X = K1 \cdot f + K2 \cdot (A_X - B2) + B2. \qquad (8)$$

It results from the equations (7) and (8), that $$A_X = K1 \cdot f/(1-K2) + B2, \qquad (9)$$

which indicates convergence of the measuring characteristics. Such a configuration, where the second offset value B2 is always added, is equally practicable.

Figure 14:
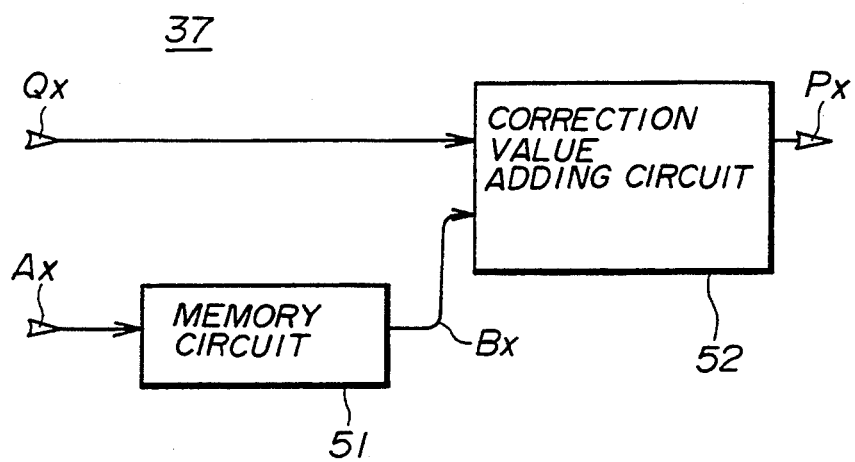
FIG. 14 is a block diagram of a correction circuit of the main portion of the second embodiment of the present invention.

FIG. 14 shows a block diagram of a correction circuit provided in the measuring circuit 10 of the second embodiment of the present invention. The correction circuit 37 of FIG. 13 is configured to comprise a memory circuit 51 and an adding circuit 52.

Generally, it is difficult to ensure high precision in analog display apparatuses because of inherent nonlinearity. This embodiment is applied when attempting to correct a display error due to this nonlinearity of analog display apparatuses.

The memory circuit 51 of FIG. 14 receives an input consisting of the output signal $A_X$ from the integrating filter circuit 40, and outputs, in response to the input value $A_X$, a correction value $B_X$ stored in advance.

Further, a correction value $B_X$ is added to the set offset value $Q_X$ in the adding circuit 52 and the sum is is output as the offset value $P_X$.

This memory circuit 51 can be configured by memory elements that are readily available. Also, it can be programmable as required or configured by simple logical circuits.

Figure 15:
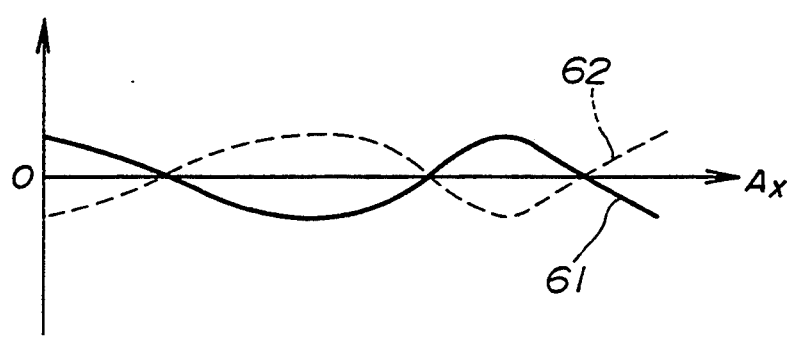
FIG. 15 is a diagram showing a graph of a correction characteristic of a measuring circuit in which the correction circuit of FIG. 14 is applied.

FIG. 15 shows a graph of an example of error characteristics of the display apparatus with respect to the output signal $A_X$ from the integrating filter circuit 40, and an example of correction characteristics of the correction circuit 37 provided for correcting the error. Referring to FIG. 15, it is apparent that such error can be very easily corrected by providing a correcting characteristic 62 that is a reversal of the error characteristic 61 with respect to the horizontal axis so that the former is invested with a characteristic that cancel the latter.

It should be noted here that since $A_X$ is fed back to the correction circuit 37 and recursively computed before being made to converge, the output signal $A_X$ to which the correction value $B_X$ is added is further added to, namely superimposed with, the correction value $B_X$ in correspondence with the output signal $A_X$ that is a result of the first addition. Accordingly, providing a correction characteristic that is a reversal of an error characteristic of the display apparatus leads to an error due to the above superimposition of the correction values. Therefore, in order to assure an improved precision, it is best to prepare, in the memory circuit 51, a correction characteristics that allows for an error due to this superimposition of correction values.

It is also possible to omit the adding circuit 52 by preparing the correction value $B_X$, to which the set offset value $Q_X$ is added in the memory circuit 51 beforehand.

Also, it is easy to produce a specialized measuring characteristic or a high-precision measuring characteristic because any correction characteristic can be obtained as desired by using the correcting circuit 37.

The logic circuits constituting the measuring circuit 10 in the above embodiment can be replaced by other logic circuits as far as they are capable of realizing essentially the same function as in the above embodiment. Also, each of the circuits shown in the block diagrams of FIGS. 3, 4, 9, 12, and, 14, which circuits pertain to the above measuring circuit 10 can be constituted of microcomputers.

Figure 16:
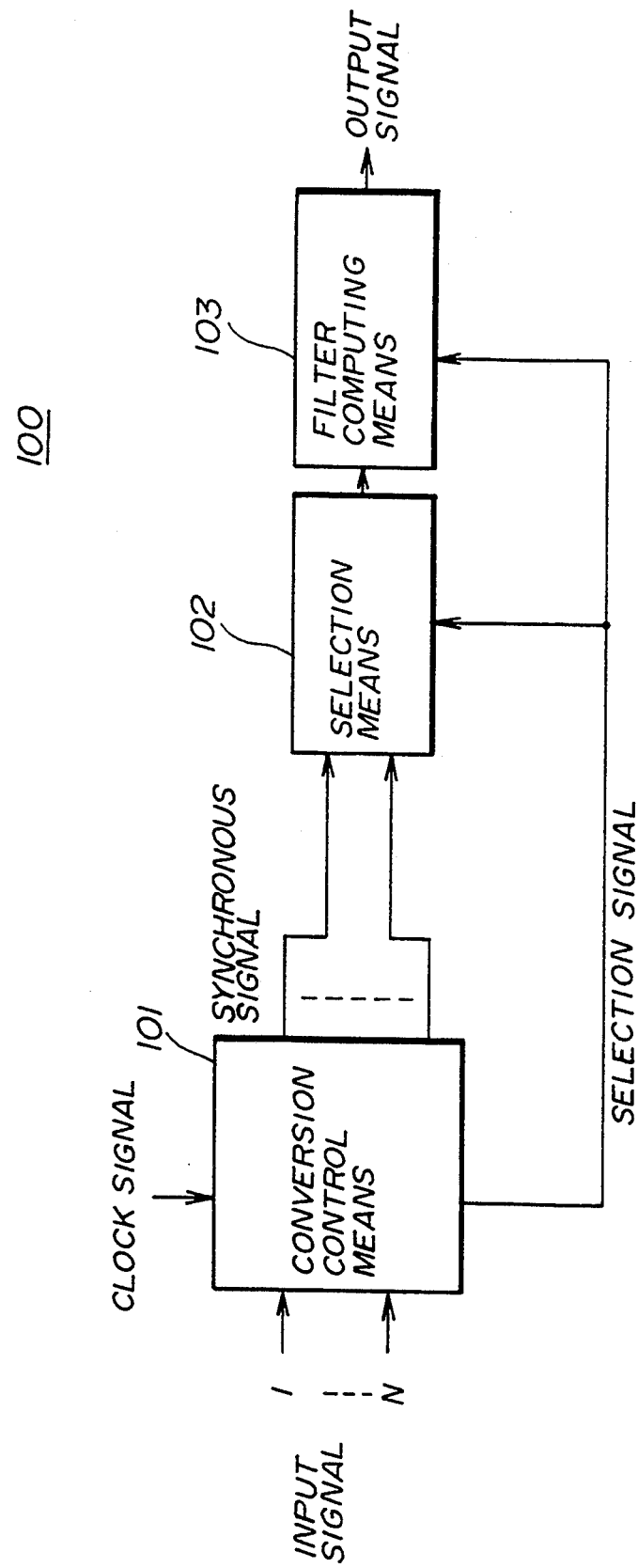
FIG. 16 is a block diagram depicting the principle of the third embodiment of the present invention.

A description will be given below of a measuring circuit 100 for measuring a speed of an automobile or a engine revolution speed, which circuit drives a speedometer and a tachometer. FIG. 16 is a block diagram describing the principle of the measuring circuit 100. In the figure, 101 represents conversion control means, 102 selection means, and 103 filter computing means.

A plurality of input signals and clock signals of frequency higher than the plurality of respective input signals are supplied to the conversion control means 101. The conversion control means 101 not only outputs the plurality of input signals as signals synchronous with the clock signals, but generates and outputs, on the basis of the clock signals, a selection signal corresponding to the plurality of synchronous signals at each predetermined cycle.

The selecting means 102 receives input consisting of the plurality of synchronous signals output from the conversion control means 101, and selects and outputs, on the basis of the selection signal output from the conversion control means 101, one of the plurality of synchronous signals.

The filter computing means 103 receives input consisting of an output synchronous signal selected by the above-mentioned selecting means 102, selects one of the predetermined filter computing processes on the basis of the selection signal, and outputs the result of the selected filter computing process performed on the output synchronous signal selected by the selecting means 102.

The principle is that the measuring circuit 100 of this embodiment selects one of a plurality of input signals on the basis of a selection signal generated on the basis of clock signals, and outputs a result of a filter computing process in correspondence with the characteristics of the input signal. In this way, a single filter computing means is capable of performing measurement of a plurality of input signals.

Figure 17:
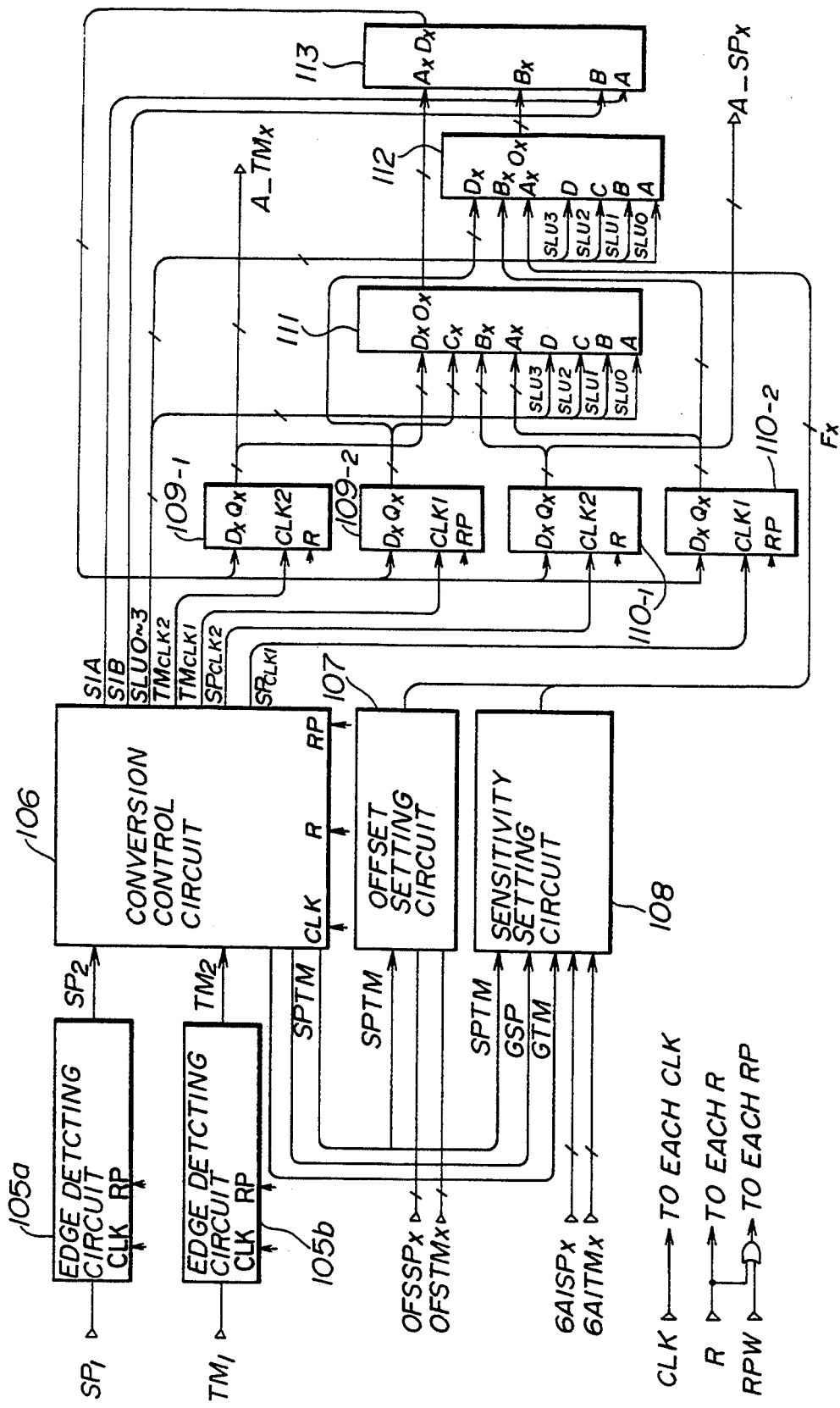
FIG. 17 is a block diagram describing a circuit of the third embodiment of the present invention.

FIG. 17 is a block diagram of a circuit configuration of this embodiment. In the figure, the notations 105a and 105b represent edge detecting circuits. The edge detecting circuit 105a detects the rise of an automobile speed pulse signal $SP_1$, obtained by shaping the automobile speed signal, and outputs it as a detection signal $SP_2$. The edge detection circuit 105b detects the rise of an engine revolution pulse signal $TM_1$ obtained by shaping the engine revolution signal, and outputs it as a detection signal $TM_2$. Since the configuration and function of the edge detecting circuits 105a and 105b are the same as the edge detecting circuit 23 of the aforementioned embodiment, the descriptions thereof are omitted.

The output detection signals $SP_2$ and $TM_2$ output from the edge detecting circuits 105a and 105b are input into the conversion control circuit 106. The conversion control circuit 106 generates and outputs, on the basis of the detection signals $SP_2$ and $TM_2$ input thereto, pulse signals including: clock signals $SP_{CLK1}$ and $SP_{CLK2}$ in correspondence with the automobile speed; clock signals $TM_{CLK1}$ and $TM_{CLK2}$ in correspondence with an engine revolution; the output selection signals SLU0-SLU3; and an offset control signal SPTM, together with gain control signals GSP and GTM.

Figure 18:
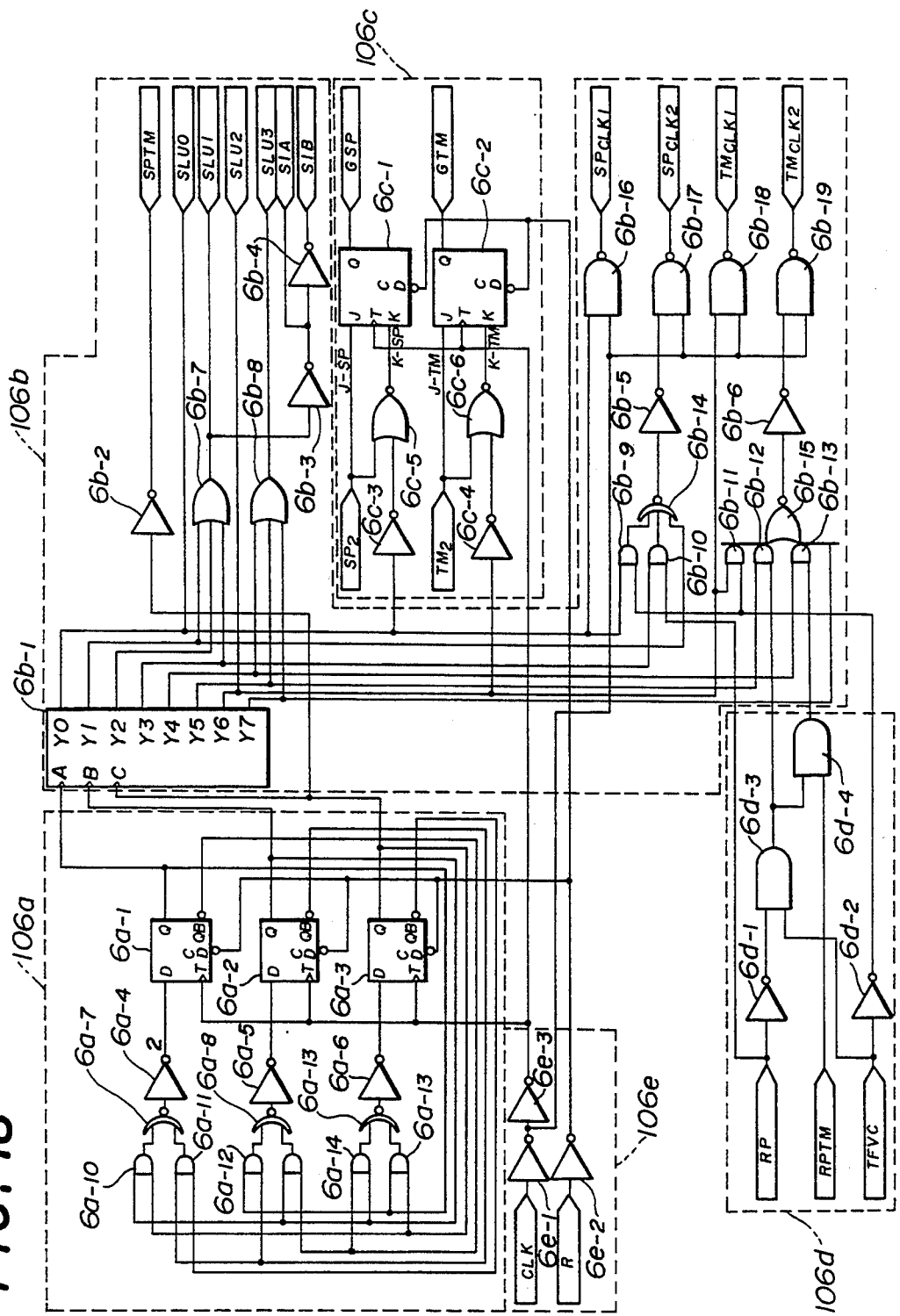
FIG. 18 is a block diagram of a conversion control circuit of the third embodiment of the present invention.

FIG. 18 is a block diagram showing a construction of a conversion control circuit. This circuit conducts a three-mode control on an operation by selecting a computing method according to input signals PRTM, RP, and TFVC, as shown in FIG. 19.

Referring to FIG. 18, 106a represents a Gray code counter circuit consisting of three D flip-flops $6a_{31}$ 1-$6a_{-3}$, inverters $6a_{-4}$-$6a_{-6}$, NOR logical circuits $6a_{-7}$-$6a_{-9}$, and AND logical circuits $6a_{-10}$-$6a_{-15}$. 106b represents a decoder circuit consisting of 3 $T_0$ 8 line decoder circuits $6b_{-1}$ (active H level output), inverters $6b_{-2}$-$6b_{-6}$, OR logical circuits $6b_{-7}$ and $6b_{-8}$, AND logical circuits $6b_{-9}$-$6b_{-13}$, NOR logical circuits $6b_{-14}$ and $6B_{-15}$, and NAND logical circuits $6b_{-16}$-$6b_{-19}$. 106c represents an input control circuit constituted of input control circuits 6c consisting of two JK flip-flops $6c_{-1}$ and $6c_{-2}$, inverters $6c_{-3}$ and $6c_{-4}$, and NOR logical circuits $6c_{-5}$ and $6c_{-6}$.

106d represents a control signal input circuit consisting of inverters $6d_{-1}$ and $6d_{-2}$, and AND logical circuits $6d_{-1}$ and $6d_{-2}$. 106e represents a clock signal input circuit consisting of inverters $6e_{-1}$-$6e_{-3}$.

The counter circuit 106a generates a 3-bit count signal, whose cycle is shown in FIG. 20 as $0 \rightarrow 1 \rightarrow 3 \rightarrow 2 \rightarrow 6 \rightarrow 7 \rightarrow 5 \rightarrow 4$, on the basis of clock signals CLK having a frequency substantially higher than the detection pulse signals SP2 and TM2 corresponding to the frequency to be measured supplied from a clock signal input circuit 106e. A signal derived from a reversal of the output Q of the D flip-flop $6a_{-3}$ is output as a switching control signal SPTM. The switching control signal SPTM is controlled such that when it is at H level, an SP processing is executed, and when it is at L level, a TM processing is executed. In this way the sharing of a computing circuit is realized.

Figure 21:
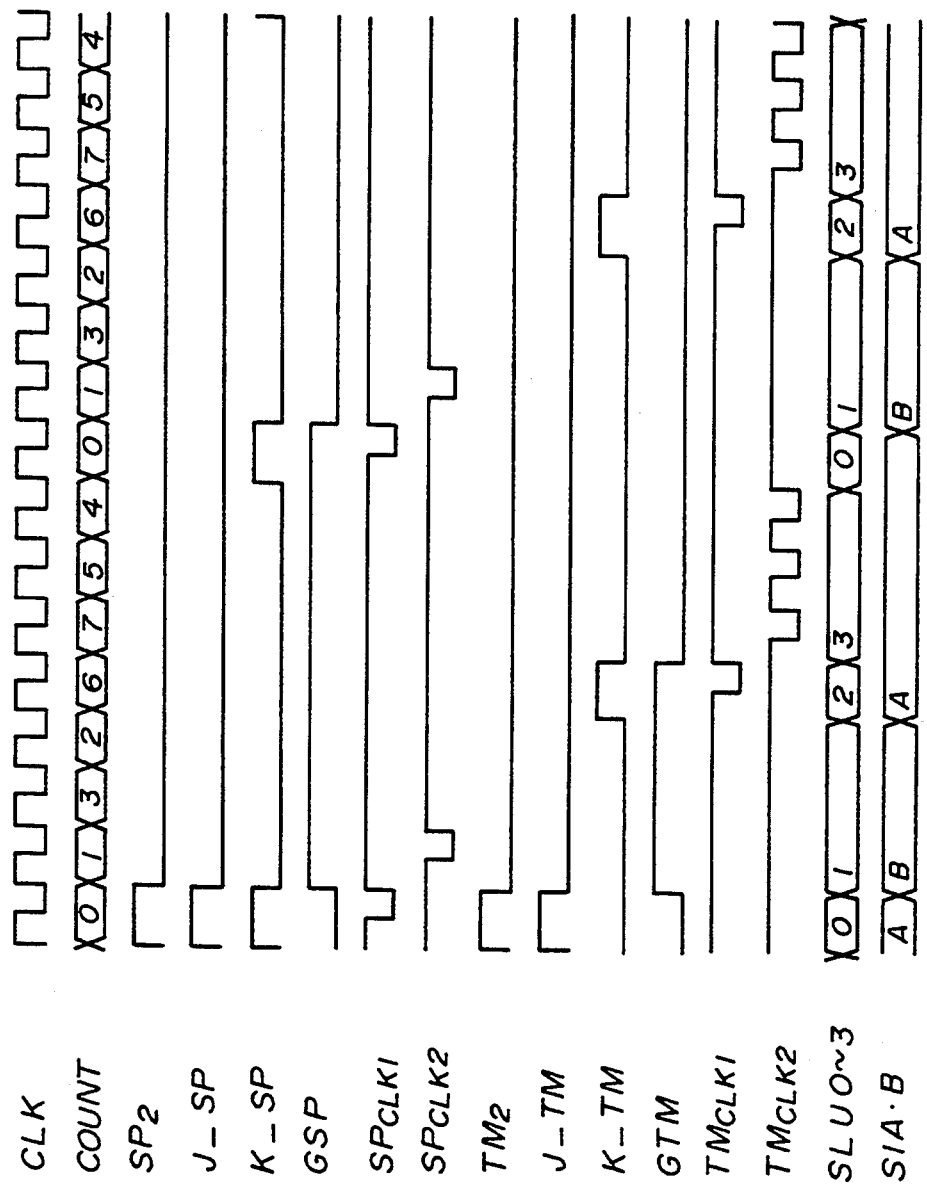
FIG. 21 is a diagram for describing an operation of the third embodiment of the present invention.

FIG. 21 is a time chart taken at a quick-response mode. The detection pulse signals SP2 and TM2 are input into J input terminals of the JK flip-flops $6a_{-1}$ and $6a_{-2}$, and the NOR logical circuits $6c_{-5}$, and $6c_{-6}$, respectively. These detection pulse signals are latched upon the next clock signal and output as sensitivity control signals GSP and GTM. The sensitivity control signals GSP and GTM are unlatched when K inputs of the JK flip-flops $6a_{-1}$–$6a_{-3}$ are turned active at count=0, in the case of GSP, and at count=6, in the case of GTM. Set sensitivity values of the sensitivity control signals GSP and GTM are added, once per every pulse, to the filter processing data $F_X$ by a sensitivity setting circuit 8. The decoder circuit 6 generates selection signals in each mode, for example, signals such as the ones shown in FIG. 22.

A further description will be given by again referring to FIG. 17. The notation $110_{-1}$ of FIG. 17 represents a first register circuit for measuring a speed of an automobile; the notation $110_{-2}$ represents a second register for measuring a speed of an automobile. Both are constituted of D flip-flops. These D flip-flops $110_{-1}$ and $110_{-2}$ receive inputs of the synchronous signals $SP_{CLK1}$ and $SP_{CLK2}$ as clock signals CLK1 and CLK2, latching the input $D_X$ and outputting it as the output $Q_X$. The notations $109_{-1}$ and $109_{-2}$ represent first and second registers for TM, which registers consist of D flip-flops and receive inputs of synchronous signals $TM_{CLK1}$ and $TM_{CLK2}$ as clock signals CLK1 and CLK2, latching the input $D_X$ and outputting it as the output $Q_X$.

107 represents an offset setting circuit for adding an offset of a measurement and selects either an offset signal OFFSSP$_X$ or an offset signal OFFSTM$_X$, on the basis of the selection signal SPTM, outputting the selection to a lower-bit block of the A$_X$ input of the correction circuit 112. The notation 108 represents a sensitivity setting circuit that determines sensitivity of measurement and selects either the sensitivity control signal GSP or the sensitivity control signal GTM on the basis of the selection signal SPTM, supplying the selection to a high-order bit block of the A$_X$ input of the correction circuit 112.

The A$_X$ input of the correction circuit 112 is represented as a correction signal F$_X$ that is a sum of higher and lower blocks set by the above-mentioned offset setting circuit 107 and sensitivity setting circuit 108. The selection circuit 111 in the next stage is constituted of multiplexers, for example, and selects one of input pulse signals A$_X$, B$_X$, C$_X$, D$_X$ on the basis of a selection input, that can be A, B, C, or D; the circuit 112 is connected to selection outputs SLU$_X$ (SLU0-3) of the conversion control circuit 106, outputting the selection as the output pulse signal O$_X$.

The circuit 112 selects either A$_X$, B$_X$, C$_X$, or D$_X$ on the basis of a selection input that can be A, B, C, or D; the circuit 112 is connected to selection outputs SLU$_X$ (SLU0-3), outputting the selection as O$_X$. B$_X$ is converted to 1/2048 and D$_X$ to 1/1024 due to a bit shift in correspondence with outputs FVD 9-2 and RVO 10-2 of register circuits 19-2 and 110-2.

The notation 113 represents a filter computing circuit and executes a computing which is dependent on selection control signals SIA and SIB of the conversion control circuit 116 in the following way.

$$SIA: D_X = B_X + A_X \cdot 1023/1024 \tag{1}$$

$$SIB: D_X = B_X + A_X \cdot 2047/2048 \tag{2}$$

In a normal mode of SP, for example, a quick-response or slow-response processing as detailed with relation to FIG. 22 is performed. Given that the outputs from the register circuits 110-1 and 110-2 are FVD10-1 and FVD10-2, where $$FVD10\text{-}2 = F_X + FVD10\text{-}2 \cdot 1023/1024 \tag{3}$$

$$FVD10\text{-}1 = FVD10\text{-}2/2048 + FVD10\text{-}1 \cdot 2047/2048. \tag{4}$$

This way, $$\text{Output Signal A\_SP}_X = FVD10\text{-}1/2048, \tag{5}$$

which is the output of the register 110-1 and the automobile speed output, is output as the result of measurement. Accordingly the measuring circuit 100 of the present invention has an effect virtually equivalent to an analog F/V conversion circuit due to the above processings of the detection pulse signals SP2 and TM2. That is, as in the case of the first and second embodiments, the result of a measurement is obtained in such a way that a frequency measured is multiplied by a value corresponding to a sensitivity set value and is added to a value corresponding to an offset set value. Further, in a TM quick-response mode shown in FIG. 22, the following computation is performed on FVD9-1 and FVD9-2, which FVD9-1 AND FVD9-2 are the outputs of the register circuits 9-1 and 9-2 and are as follows.

$$FVD9\text{-}2 = F_X + FVD9\text{-}2 \cdot 1023/1024 \tag{6}$$

$$FVD9\text{-}2 = FVD9\text{-}2/1024 + FVD9\text{-}2 \cdot 1023/1024 \tag{7}$$

In this way A_TM$_X$=FVD9-4/2048, which is the signal output from the register 9-1 and the engine revolution speed output, is output as the result of measurement. It is possible to increase the speed of indication response by performing the computation of the equation (7) a plurality of times.

In the zero reset mode, it is possible to reset the register circuits 109-1 and 110-1 forcefully by using a zero reset signal PW at the time of a low voltage so that the indication of zero is resumed promptly and smoothly.

As has been described, this embodiment makes it possible to perform, by means of a single computing circuit 113, filter processings in correspondence with input signals that belong to two different lines of processing. This eliminates the need for providing a plurality of similar computing circuits, thereby allowing the design of inexpensive measuring circuits.

The present invention is not limited to these embodiments, but various variations and modifications may be made without departing from the scope of the present invention.

What is claimed is:

1. A measuring circuit for conducting measurement by converting a frequency of a pulse train input signal having rising and trailing edges to a signal having digital values in correspondence with said frequency, said measuring circuit also displaying a measurement value on a display and comprising:

clock pulse generating means for generating clock pulses having a frequency higher than the frequency of said input signal;

edge detecting means, connected to said clock pulse generating means, for detecting either the rising edges or the trailing edges of said input signal after sampling said input signal on the basis of said clock pulses and for outputting an edge detection signal, which edge detection signal represents an existence/nonexistence of the edges of said input signal, the edge detection signal being synchronous with said clock pulses;

gate means, connected to said edge detecting means, for outputting a signal representing a first factor when receiving the edge detection signal from said edge detecting means, said first factor determining a measurement sensitivity of said circuit; and a first digital filter, connected in circuit to said gate means to receive said signal representing said first factor and connected in circuit to said clock pulse generating means to receive said clock pulses, for outputting a signal having digital values, which values correspond to the frequency of said input signal and which values are determined by said first factor on the basis of sampling effected synchronously with a cycle of said clock pulses.

2. A measuring circuit as claimed in claim 1, further comprising waveform shaping means for shaping a waveform of said input signal into a roughly rectangular shape, said shaped input signal having a first predetermined value and a second predetermined value greater than said first predetermined value, and wherein said edge detecting means performs sampling of said shaped input signal on the basis of said clock pulses, and outputs an edge detection signal synchronous with said clock pulses when a value of said shaped input signal has shifted from said first value to said second value or from said second value to said first value.

3. A measuring circuit as claimed in claim 1, wherein said first digital filter comprises: delaying means for retaining an input of a previous sampling; first multiplying means for multiplying the input of said previous sampling retained by said delaying means by a positive value smaller than 1; adding means for adding an output from said first multiplying means to an input of a present sampling, and for inputting a resulting sum into said delaying means; and second multiplying means for multiplying an output from said delaying means by a second factor stored in said second multiplying means so that a resulting product has an appropriate value for a next process, and for outputting said product.

4. A measuring circuit as claimed in claim 1, further comprising correcting means for outputting a second factor for correcting an output of said first digital filter; and adding means connected to said first digital filter and said correcting means, by which adding means an output of said gate means is added to said second factor, a resulting sum being input into said first digital filter.

5. A measuring circuit as claimed in claim 4, wherein said correcting means comprises:

determining means for comparing an output from said first digital filter with a predetermined value;

multiplying means for multiplying an output from said first digital filter by a third factor stored in said multiplying means so that a product thereof has an appropriate value for a next process;

selecting means for outputting said second factor when said determining means determines that the output from said first digital filter is larger than the predetermined value, and for selecting and outputting the output from said multiplying means to said adding means when the output from said first digital filter is smaller than the predetermined value.

6. A measuring circuit as claimed in claim 4, wherein said correcting means comprises memory means for correcting the output from said first digital filter to be a predetermined value, and correction value adding means for adding an output from said memory means to said second factor, the sum being output from the correction value adding means.

7. A measuring circuit as claimed in claim 1 comprising driving means to which the output from said first digital filter is input so as to be converted thereby to a signal for driving said display apparatus.

8. A measuring circuit according to claim 4 comprising driving means to which the output from said first digital filter is input so as to be connected thereby to a signal for driving said display, said measuring circuit further comprising a second digital filter connected to said first digital filter, the measuring circuit executing filter processing on the output of said first digital filter, the output from said second digital filter being input into said driving means, and the output from said second digital filter being input into said correcting means.

9. A measuring circuit for converting frequencies of a plurality of pulse train input signals having rising and trailing edges into a signal having digital values in correspondence with each of said frequencies, said measuring circuit also selectively displaying a measurement value on a display and comprising:

clock pulse generating means for generating clock pulses having a frequency higher than the frequencies of said plurality of input signals;

a plurality of edge detecting means, connected to said clock pulse generating means, for detecting either the rising edges or the trailing edges of said input signals after sampling said input signals on the basis of said clock pulses and for outputting a respective plurality of edge detection signals, which edge detection signals represent an existence/nonexistence of the edges of said input signals respectively, the edge detection signals being synchronized with said clock pulses to yield a plurality of synchronous signals;

conversion control means, connected to said plurality of edge detecting means and said clock pulse generating means, for sequentially outputting said plurality of input signals synchronous with said clock pulses, and for sequentially generating and outputting a selection signal for said plurality of input signals, the generating and the output of said selection signal being performed on the basis of said clock pulses at every predetermined cycle, the output timing of said plurality of input signals output from said conversion control means being controlled on the basis of a time sharing process;

selecting means, connected to said conversion control means, for receiving an input comprising said plurality of synchronous signals, and for selecting and outputting one of said plurality of synchronous signals, on the basis of said selection signal; and a first digital filter, connected in circuit to said selecting means to receive the synchronous signal selected by said selecting means, and connected in circuit to said clock pulse generating means to receive said clock pulses, for outputting a signal having digital values that correspond to the frequency of one of said synchronous signals selected by said selecting means, said outputting of the signal having the digital values being performed on the basis of a sampling synchronous with a cycle of said clock pulses.

10. A measuring circuit as claimed in claim 9, further comprising waveform shaping means for shaping waveforms of said plurality of input signals into a roughly rectangular shape, said shaped input signals having a first predetermined value and a second predetermined value greater than said first value, and wherein said edge detecting means performs sampling of said shaped input signal on the basis of said clock pulses, and outputs an edge detection signals synchronous with a clock pulses when a value of said shaped input signal has shifted from said first predetermined value to said second predetermined value or from said second predetermined value to said first predetermined value.

11. A measuring circuit as claimed in claim 9, wherein said first digital filter comprises: delaying means for retaining an input of a previous sampling; first multiplying means for multiplying the input of the previous sampling retained by said delaying means by a positive value smaller than 1; adding means for adding an output from said first multiplying means to an input of a present sampling and for inputting the sum thereof into said delaying means; and second multiplying means for multiplying an output from said delaying means by a second factor stored in said second multiplying means so that a resulting product has an appropriate value for a next process, and for outputting said product.

12. A measuring circuit as claimed in claim 9, further comprising correcting means for outputting a second factor for correcting an output of said first digital filter, and adding means connected to said first digital filter and said correcting means, by which adding means an output of said conversion control means is added to said second factor, a resulting sum being input into said first digital filter.

13. A measuring circuit as claimed in claim 12, wherein said correcting means comprises:

determining means for comparing an output from said first digital filter with a predetermined value;

multiplying means for multiplying an output from said first digital filter by a third factor stored in said multiplying means so that a resulting product has an appropriate value for a next process;

selecting means for outputting said second factor when said determining means determines that the output from said first digital filter is larger than the predetermined value, and for selecting and outputting the output from said multiplying means to said adding means when the output from said first digital filter is smaller than the predetermined value.

14. A measuring circuit as claimed in claim 12, wherein said correcting means comprises memory means for correcting the output from said first digital filter to be a predetermined value, and correction value adding means for adding an output from said memory means to said second factor, the sum being output from the correction value adding means.

15. A measuring circuit as claimed in claim 9, comprising driving means to which the output from said first digital filter is input so as to be converted thereby to a signal for driving said display.

16. A measuring circuit according to claim 12 comprising driving means to which the output from said first digital filter is input so as to be connected thereby to a signal for driving said display, said measuring circuit further comprising a second digital filter connected to said first digital filter, the measuring circuit executing filter processing on the output of said first digital filter, the output from said second digital filter being input into said driving means, and the output from said second digital filter being input into said correcting means.

* * * * *

UNITED STATES PATENT AND TRADEMARK OFFICE
CERTIFICATE OF CORRECTION

PATENT NO. : 5,357,196
DATED : October 18, 1994
INVENTOR(S) : Ito

It is certified that error appears in the above-indentified patent and that said Letters Patent is hereby corrected as shown below:

On the title page, item

[54] In the Title    Delete "SO" and substitute therefor ---TO---

Signed and Sealed this

Twenty-first Day of February, 1995

Attest:

BRUCE LEHMAN

*Attesting Officer*        *Commissioner of Patents and Trademarks*